US008283107B2

(12) United States Patent
Melamed et al.

(10) Patent No.: US 8,283,107 B2
(45) Date of Patent: Oct. 9, 2012

(54) IMAGEABLE ELEMENTS AND METHODS USEFUL FOR PROVIDING WATERLESS PRINTING PLATES

(75) Inventors: Ophira Melamed, Shoham (IL); Jianbing Huang, Trumbull, CT (US); Efrat Konstantini, Bat-Yam (IL)

(73) Assignee: Eastman Kodak Company, Rochester, NY (US)

( * ) Notice: Subject to any disclaimer, the term of this patent is extended or adjusted under 35 U.S.C. 154(b) by 515 days.

(21) Appl. No.: 12/133,397

(22) Filed: Jun. 5, 2008

(65) Prior Publication Data

US 2009/0305162 A1 Dec. 10, 2009

(51) Int. Cl.
*G03F 7/00* (2006.01)
*G03F 7/26* (2006.01)

(52) U.S. Cl. ............... 430/272.1; 430/270.1; 430/281.1; 430/294; 430/302; 101/450.1; 101/463.1

(58) Field of Classification Search ............... 430/270.1, 430/271.1, 275.1, 302; 101/450.1, 453
See application file for complete search history.

(56) References Cited

U.S. PATENT DOCUMENTS

| | | | | |
|---|---|---|---|---|
| 4,342,820 | A | 8/1982 | Kinashi et al. | |
| 5,339,737 | A | 8/1994 | Lewis et al. | |
| 5,353,705 | A | 10/1994 | Lewis et al. | |
| 5,464,686 | A | 11/1995 | Higashi et al. | |
| 5,919,600 | A | 7/1999 | Huang et al. | |
| 6,074,797 | A * | 6/2000 | Suezawa et al. | 430/166 |
| 6,096,476 | A | 8/2000 | Yanagida et al. | |
| 6,194,122 | B1 * | 2/2001 | Ichikawa et al. | 430/272.1 |
| 6,284,433 | B1 | 9/2001 | Ichikawa et al. | |
| 6,479,207 | B1 * | 11/2002 | Mori | 430/138 |
| 6,843,176 | B2 | 1/2005 | Ray et al. | |
| 6,964,841 | B2 | 11/2005 | Iihara et al. | |
| 7,273,689 | B2 | 9/2007 | Wieland et al. | |
| 2007/0128546 | A1 * | 6/2007 | Saraiya et al. | 430/271.1 |
| 2008/0227023 | A1 * | 9/2008 | Savariar-Hauck et al. | 430/199 |
| 2009/0253069 | A1 * | 10/2009 | Melamed et al. | 430/270.1 |

OTHER PUBLICATIONS

U.S. Appl. No. 12/060,906, filed Apr. 2, 2008, titled Imageable Elements Useful for Waterless Printing, by Ophira Melamed et al.

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

An imageable element can be imaged using non-ablative processes. This element has a non-silicone, non-crosslinked layer contiguous to and under an ink-repelling crosslinked silicone rubber layer. These elements can be used for providing lithographic printing plates useful for waterless printing (no fountain solution). Processing after imaging is relatively simple with either water or an aqueous solution consisting essentially of a surfactant or mechanical means to remove the crosslinked silicone rubber layer and a minor portion of the non-silicone, non-crosslinked layer in the imaged regions.

16 Claims, No Drawings

IMAGEABLE ELEMENTS AND METHODS USEFUL FOR PROVIDING WATERLESS PRINTING PLATES

FIELD OF THE INVENTION

This invention provides an improved non-ablative imageable element that can be imaged without ablation and then developed with a simple aqueous solution and used for "waterless" printing. This invention also provides a method of using such non-ablative imageable elements.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Waterless printing plates have been known and used since 1970. These printing plates can be used for printing without the need for dampening water (fountain solution) on-press. Most waterless printing plates involve an ink-repelling layer such as a silicone layer overlying a radiation-sensitive layer and substrate that are more ink-receptive. Some details of waterless printing and its advantages are provided, for example, at www.waterless.org that is a web site for the Waterless Printing Association.

For example, some of the benefits of waterless printing include consistent color in the image (better color fidelity), better color saturation, and lower dot gain (more detail). In addition, because a fountain solution is not used during printing, a greater variety of papers including uncoated papers, can be used in printing. Moreover, faster make-readies can be achieved with waterless printing and small compact printing presses can be used so that printing operations can be carried out in smaller facilities (less investment in equipment and buildings). By avoiding the use of a fountain solution, waterless printing is better for the environment. Printing operators no longer need to carefully balance fountain solution and lithographic printing ink and can carry out their operations with less training.

Positive-working waterless printing plates have been prepared from imageable elements containing a negative-working diazo resin and UV irradiation. Negative-working waterless printing plates have been obtained using UV irradiation and diazonaphthoquinone-containing imageable elements or acid-catalyzed chemistries.

The majority of the early waterless printing plates were prepared using a photographic film. The use of such films is expensive and tedious. These disadvantages were addressed in recent years with "computer-to-plate" (CTP) technologies whereby waterless printing plates are imaged directly by computer-generated signals using one or more lasers. For example, this can be done with CTP platesetters.

One method for preparing waterless printing plates includes generating a contact mask on a radiation-sensitive imageable element. The mask can be produced, for example, using a digital device such as an inkjet printer, electrographic printer, or any other apparatus containing a digitally controlled laser. Laser ablation, laser ablative transfer, or laser-induced color change techniques can also be used to produce the mask. However, the use of masks to produce waterless printing plates is expensive and requires complicated processing methods.

Two commercial types of thermal (computer-to-plate, or "CTP") waterless printing systems are known. One waterless printing system includes imaging by laser ablation that includes a destructive breaking away or volatilization and removal of the matter in the imaged layer(s). Ablative imaging requires very high imaging energy (the imageable elements have relatively slow imaging speed) and creates considerable debris and gaseous effluents that must be captured or released into the environment. U.S. Pat. No. 5,339,737 (Lewis et al.) and U.S. Pat. No. 5,353,705 (Lewis et al.) describe multi-layer ablatable elements and imaging systems for making waterless printing plates.

Another waterless printing system requires thermal imaging with a laser (perhaps through a mask) to solubilize imaged layers that are then removed in imaged regions by using a developer that often contains an organic solvent or by using a pretreatment solution, or both, as described, for example in U.S. Pat. No. 4,342,820 (Kinashi et al.), U.S. Pat. No. 6,074,797 (Suezawa et al.), U.S. Pat. No. 6,284,433 (Ichikawa et al.), and U.S. Pat. No. 6,964,841 (Iihara et al.). In addition, U.S. Pat. No. 6,194,122 (Ichikawa et al.) describes waterless printing plates formed by lamination.

U.S. Pat. No. 5,919,600 (Huang et al.) describes a two-layer non-ablative imageable element that can be used to provide waterless printing plates using solvent-containing developers to remove the solubilized imageable layer and overlying silicone layer.

Copending and commonly assigned U.S. Ser. No. 12/060,609 (filed Apr. 2, 2008 by Melamed, Huang, Konstantini, and Matzner) describes three-layer imageable elements that can be used to provide lithographic printing plate useful in waterless printing.

Problem to be Solved

Waterless printing is a desired printing technique that can be used without a fountain solution and can provide several advantages. There is a need for digitally imageable elements that can be used to provide waterless printing plates without ablation imaging or development using developers containing predominantly environmentally unfriendly organic solvents. Ablation imaging frequently causes problems with pieces of silicone rubber contaminating conveying rollers in CTP platesetters, causing imaging problems from one printing plate to another. In addition, there is a need to provide a simple imageable element that can be used to prepare waterless printing plates without pretreatment before development. It is also desired that when silicone is removed from the element during development, silicone debris is removed in small pieces that do not clog the processor or contaminate CTP platesetters.

SUMMARY OF THE INVENTION

This invention provides an imageable element that is imageable using a non-ablative process and useful for waterless printing, the element comprising a substrate having thereon, in order, the following contiguous essential layers:

a non-silicone, non-crosslinked layer comprising a first polymeric binder and an infrared radiation absorbing compound, and a crosslinked silicone rubber layer disposed directly on the non-silicone, non-crosslinked layer, wherein the non-silicone, non-crosslinked layer has chemical resistance such that the loss in dry coating weight is less than 35% as demonstrated by soaking the dried non-silicone, non-crosslinked layer alone on a substrate for five minutes in a 2-butoxyethanol:water 80:20 weight solution at room temperature.

This invention also provides a method of making an imaged element suitable for waterless printing, the method comprising, without ablation:

A) imagewise exposing an imageable element that is imageable by a non-ablative process and useful for waterless printing using infrared radiation to provide both exposed and non-exposed regions in the imageable element, the non-ablative imageable element comprising a substrate having thereon, in order, the following contiguous essential layers:

a non-silicone, non-crosslinked layer comprising a first polymeric binder and an infrared radiation absorbing compound, and a crosslinked silicone rubber layer disposed directly on the non-silicone, non-crosslinked layer, and B) removing the crosslinked silicone rubber layer and an upper portion of less than 10% of said non-silicone, non-crosslinked layer predominantly only in the exposed regions to provide an imaged element, solely by:

(a) contacting the imagewise exposed imageable element with water or an aqueous solution comprising less than 8 weight % organic solvents, (b) by applying mechanical removal means to the imagewise exposed imageable element, or (c) by a combination of contacting the imagewise exposed imageable element with water or an aqueous solution comprising less than 8 weight % organic solvents and applying mechanical removal means.

Moreover, this invention also provides a method of making printed images by waterless printing, the method comprising, without ablation:

A) imagewise exposing an imageable element that is imageable by a non-ablative process using infrared radiation to provide both exposed and non-exposed regions in the imageable element, the imageable element comprising a substrate having thereon, in order, the following contiguous essential layers:

a non-silicone, non-crosslinked layer comprising a first polymeric binder and an infrared radiation absorbing compound, and a crosslinked silicone rubber layer disposed directly on the non-silicone, non-crosslinked layer, B) removing the crosslinked silicone rubber layer and an upper portion of less than 10% of the non-silicone, non-crosslinked layer in predominantly only the exposed regions to provide an imaged element, and C) contacting the imaged element on-press with only a lithographic printing ink.

In some embodiments, the crosslinked silicone rubber layer is derived from either Composition I or Composition II that are defined as follows:

Composition I that comprises:

(a) a polysiloxane material having predominantly dimethylsiloxane units and siloxane units represented by the following Structure (PSR):

$$—[Si(R_1)(R_2)—O]— \quad \text{(PSR)}$$

wherein $R_1$ and $R_2$ are independently alkyl, aryl, and alkenyl groups as long as at least one is an alkenyl group, (b) a silane crosslinking agent having SiH groups, (c) a platinum catalyst, and (d) optionally a stabilizer, or adhesion promoter, or both, Composition II that comprises:

(a) a polydimethylsiloxane having SiOH, $SiOR_3$, or $SiOCOR_4$ terminal groups, or any combination thereof, wherein $R_3$ and $R_4$ are independently substituted or unsubstituted alkyl, alkenyl, or aryl groups, (b) a siloxane crosslinking agent having at least two of any of the SiOH, $SiOR_3$, or $SiOCOR_4$ groups, wherein $R_3$ and $R_4$ are as defined above, and (c) optionally a catalyst, adhesion promoter, or both.

The present invention provides an imageable element that can be imaged in a simple non-ablative imaging process and then used for providing printing plate for waterless printing. The novel elements of this invention are simple in that they have only two essential layers that are contiguous (adjacent) including a crosslinked silicone rubber layer that is ink repelling in nature. Underneath this layer is a non-silicone, non-crosslinked layer and during imaging, only a small upper portion (less than 10% of total) of this layer is removed along with the overlying crosslinked silicone rubber layer during development.

This non-silicone, non-crosslinked layer is the only layer that contains an infrared radiation absorbing compound to provide thermal sensitivity. Thus, a residue of the non-silicone, non-crosslinked layer is left on the substrate in the exposed regions. A simple solution such as water or an aqueous solution containing a surfactant can be used for development. Developers that contain more than 8% organic solvents can be avoided in the practice of this invention. In some embodiments, the developing solution is used in combination with a mechanical removal means (described below).

In carrying out the present invention, we believe that the interface between the non-silicone, non-crosslinked layer and the overlying crosslinked silicone rubber layer undergoes thermal disruption, causing disconnection or irreversible delamination between the two layers. The non-ablative imaging does not ablate the crosslinked silicone rubber layer nor is that layer removed by solubilization of the non-silicone, non-crosslinked layer using pretreatment solutions prior to development. Washing and rubbing the imaged element with water removes the disconnected or delaminated crosslinked silicone rubber layer material from the imaged regions. The water acts as a lubricant, preventing scratching during the mechanical rubbing and development of the non-imaged regions. There is no chemical processing by the water, and the water does not penetrate through the crosslinked silicone rubber layer into the underlying layer.

In the waterless printing elements described in the prior art, for example, U.S. Pat. No. 6,284,433 (Col. 19, lines 24-52), a pretreatment step is used to solubilize the layer underneath the silicone rubber layer. Thus, the pretreatment solution must penetrate the silicone rubber layer into the underlying layer. This is possible when the silicone rubber layer is swollen in the pretreatment solution and is designed particularly to have certain swellability in the pretreatment solution. This design feature is not necessary in the present invention because of the different imaging and development mechanism. Thus, the mechanism of the present invention appears to be unlike any other digital waterless printing plate imaging and development.

U.S. Pat. No. 6,843,176 (Ray et al.) and U.S. Pat. No. 7,723,689 (Wieland et al.) describe formulations useful as underlayers in positive-working imageable elements. The described imageable elements are not designed for waterless printing since the layers are disrupted and removed using alkaline development. Thus, it is surprising that the underlayer formulations described therein could be used in negative-working imageable elements designed for waterless printing according to the present invention.

We also found that the silicone debris is removed during development in relatively small pieces so that clogging of the processor and contamination of imaged elements is less likely.

We further found that the imageable elements of this invention have high imaging sensitivity and can be imaged using an imaging energy as low as 130 $mJ/cm^2$, which is considerably lower than the energy generally used for ablation imaging.

DETAILED DESCRIPTION OF THE INVENTION

Definitions

Unless the context indicates otherwise, when used herein, the terms "imageable element", "non-ablative imageable element", and "lithographic printing plate precursor" are meant to be references to embodiments of the present invention.

In addition, unless the context indicates otherwise, the various components described herein such as "first polymeric binder", "radiation absorbing compound", "IR dye", "polysiloxane material", "silane crosslinking agent", "polydimethylsiloxane", "catalyst", "adhesion promoter", and similar terms also refer to mixtures of such components. Thus, the use of the article "a" or "an" is not necessarily meant to refer to only a single component.

By the term "predominantly only said exposed regions" during development, we mean that the exposed regions of the non-silicone non-crosslinked layer and crosslinked silicone rubber layer are selectively and preferentially removed during processing, but not the non-exposed regions to any significant extent (there may be insubstantial removal of the non-exposed regions).

By the term "upper portion" of the non-silicone, non-crosslinked layer, we mean that less than 10 weight % of that layer in the exposed regions is decomposed and non-ablative removed during development so that the overlying crosslinked silicone rubber layer is entirely removed in the exposed regions. A residue of the non-silicone layer is left after thermal imaging and development so that the substrate is entirely covered after development with first polymeric binder.

By "computer-to-plate" (CTP), we mean the imaging means is carried out using a computer-directed imaging means (such as a laser) directly to the imageable element without using masking or other intermediate imaging films.

By "non-ablative", we mean that the thermally imaged regions are not substantially volatilized or removed by mere imaging alone and little or no gases are generated during thermal imaging in the practice of this invention.

Unless otherwise indicated, percentages refer to percents by dry weight, either the dry solids of an imageable layer formulation or the dry coated weight of a layer. Unless otherwise indicated, the weight percent values can be interpreted as for either a layer formulation or a dried layer coating.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements described herein can be used in a number of ways such as precursors to lithographic printing plates (or as "printing plate blanks") as described in more detail below. However, this is not meant to be their only use. For example, the imageable elements can also be used as thermal patterning systems and to form masking elements and printed circuit boards.

Imageable Elements

In general, the imageable elements have a substrate and two contiguous essential layers that are a non-silicone, non-crosslinked layer and an overlying crosslinked silicone rubber layer. However, there can be a protective layer over the crosslinked silicone rubber layer. There can also be a primer or adhesion layer to adhere the non-silicone, non-crosslinked layer to the substrate.

Substrate:

The imageable elements are formed by suitable application of a non-silicone, non-crosslinked layer formulation or composition onto a suitable substrate. This substrate can be a raw support material but can be treated or coated in various ways to make it less reflective and thereby easier for image inspection for quality purposes prior to application of the non-silicone layer composition as well as to improve adhesion to that layer. The substrate comprises a support that can be composed of any dimensionally stable material that is conventionally used to prepare imageable elements such as lithographic printing plates. The substrate can be treated to provide an "interlayer" for improved adhesion and the first layer formulation is applied over the interlayer.

The substrate is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance adhesion or reflective properties, or paper supports may be similarly coated to enhance planarity. Examples of subbing layer materials include but are not limited to, alkoxysilanes, aminopropyltriethoxy-silanes, glycidioxypropyl-triethoxysilanes, and epoxy functional polymers, as well as conventional subbing materials.

A useful substrate is composed of an aluminum-containing support that may be coated or treated using techniques known in the art, including physical graining, electrochemical graining, chemical graining, and anodizing.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof.

The thickness of the substrate can be varied but should be sufficient to sustain the wear from printing and thin enough to wrap around a printing form. Such embodiments typically include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the layer compositions applied thereon, and thus be an integral part of the printing press or a sleeve that is incorporated onto a press cylinder. The use of such imaged cylinders is described for example in U.S. Pat. No. 5,713,287 (Gelbart).

Non-Silicone, Non-Crosslinked Layer:

The non-silicone, non-crosslinked layer is disposed between the crosslinked silicone rubber layer and the substrate. Typically, it is disposed directly on the substrate (including any primer coatings as described above). The non-silicone, non-crosslinked layer comprises a first polymeric binder and the layer is only partially removed during development (described below). The amount of partial removal can be determined by gravimetric analysis.

It is advantageous that the polymeric binders used in the non-silicone, non-crosslinked layer have high resistance to the chemical solvents that may be used in development and to lithographic printing inks and printing press cleaning fluids. Such resistance can be measured by dipping the element for various periods of time in a specific solvent or chemical and measuring the weight of the remaining coating. A higher remaining coating weight is an indication of higher chemical resistance.

For example, solvent resistance of the non-silicone, non-crosslinked layer can be evaluated by soaking a coated and dried layer formulation (on an aluminum substrate) for 5 minutes in a 80:20 weight mixture of 2-butoxyethanol (Butyl Cellusolve) and water at room temperature, and measuring the percentage weight loss of that layer after it is dried again. For example, a non-silicone, non-crosslinked layer formulation has the desired solvent resistance when the coating weight loss using the noted test is less than 35%. However, any improvement in chemical resistance is evident when the coating weight loss is less than a known layer formulation. Butyl Cellusolve is a solvent commonly used in UV washes (the fluids used to clean UV inks from printing plates and blanket rollers on-press). Other glycol ethers are sometimes used in UV washes but it is believed that resistance to Butyl Cellusolve in the noted mixture is a good indicator of chemical resistance to all solvents used during printing, especially when UV inks are involved.

Useful first polymeric binders for the non-silicone, non-crosslinked layer include recurring units derived from one or more of (meth)acrylonitrile or N-substituted cyclic imides (such as N-phenyl maleimide, N-cyclohexyl-maleimide, N-(4-carboxyphenyl)maleimide, N-benzylmaleimide, or a mixture thereof), and optionally comprising recurring units derived from a (meth)acrylamide such as acrylamide, methacrylamide, N-alkoxyalkyl methacrylamide, N-hydroxymethyl acrylamide and N-hydroxymethyl methacrylamide. For example, the first polymer may be derived at least in part from an N-substituted cyclic imide, a (meth)acrylonitrile, and a (meth)acrylamide. For example, the amount of recurring units derived from a (meth)acrylonitrile can be from about 20 to about 50 mol %, the amount of recurring units derived from an N-substituted cyclic imide can be from about 20 to about 75 mol %, and the amount of recurring units derived from other monomers such as a (meth)acrylamide can be from 0 to about 50 mol %.

The non-silicone, non-crosslinked layer may also comprise one or more secondary polymeric materials that are resins having activated methylol and/or activated alkylated methylol groups as long as the chemical resistance test noted above is still met.

The secondary polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for examples GP649D99 resole (Georgia Pacific) and BKS-5928 resole resin (Union Carbide).

Useful polymeric materials can also include copolymers that comprise from about 25 to about 75 mole % of recurring units derived from N-phenylmaleimide, from about 10 to about 50 mole % of recurring units derived from methacrylamide, and from about 5 to about 30 mole % of recurring units derived from methacrylic acid. These secondary additional copolymers are disclosed in U.S. Pat. No. 6,294,311 (Shimazu et al.) and U.S. Pat. No. 6,528,228 (Savariar-Hauck et al.).

The first polymeric binder and the secondary polymeric materials useful in the non-silicone, non-crosslinked layer can be purchased from several commercial sources or prepared by methods, such as free radical polymerization, that are well known to those skilled in the art and that are described, for example, in Chapters 20 and 21, of *Macromolecules*, Vol. 2, 2nd Ed., H. G. Elias, Plenum, New York, 1984. The first polymeric binders described above generally comprise at least 50 weight % and typically from about 60 to about 90 weight % and this amount can be varied depending upon what other polymers and chemical components are present. Any secondary polymeric materials (such as a novolak, resole, or copolymers noted above) can be present in an amount of from about 5 to about 45 weight %.

The non-silicone, non-crosslinked layer also includes one or more infrared radiation absorbing compounds ("IR absorbing compounds") that absorb radiation from about 600 to about 1500 nm and typically from about 700 to about 1200 nm with minimal absorption at from about 300 to about 600 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S Patent Application Publication 2005-0130059 (Tao). A general description of one class of suitable cyanine dyes is shown by the formula in paragraph 0026 of WO 2004/101280 (Munnelly et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), and U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds include pigments such as carbon blacks including those that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The radiation absorbing compound is generally present in the imageable element in an amount of at least 8% and up to 30 weight % and typically from about 10 to about 25 weight % (based on total dry non-silicone, non-crosslinked layer weight). The particular amount needed for this purpose would be readily apparent to one skilled in the art, depending upon the specific compound used and the imaging conditions to be used.

The non-silicone, non-crosslinked layer can also include other components such as surfactants, dispersing aids, humectants, biocides, viscosity builders, drying agents, defoamers, preservatives, antioxidants, and colorants, or combinations thereof, all in known amounts.

The non-silicone, non-crosslinked layer can also comprise an adhesion promoting compound that promotes adhesion between the second layer and the silicone rubber layer (described below). The adhesion promoting compound generally comprises one or more vinyl, SiH, SiOH, $SiOR_3$, $SiOCOR_4$, or epoxy groups wherein $R_3$ and $R_4$ are independently substituted or unsubstituted alkyl or aryl groups wherein the alkyl groups can have 1 to 20 carbon atoms and the aryl groups are generally phenyl or naphthyl groups.

The non-silicone, non-crosslinked layer generally has a dry coating coverage of from about 0.5 to about 5 $g/m^2$ and typically from about 0.7 to about 3 $g/m^2$.

Useful examples of non-silicone, non-crosslinked layer formulations onto which the crosslinked silicone rubber layer can be disposed are the underlayer formulations (or bottom layers) described, for example, in U.S. Pat. Nos. 6,843,176 and 7,723,689 both of which are noted above and incorporated herein by reference with respect to their teaching concerning such formulations.

Crosslinked Silicone Rubber Layer:

The crosslinked silicone rubber layer disposed on the non-silicone layer is an ink repellant layer that may be formed from either an addition type silicone rubber or a condensation type silicone rubber.

Generally, the silicone rubber is a crosslinked silicone rubber that is derived from either Composition I or Composition II defined as follows:

Composition I:

(a) a polysiloxane material having predominantly dimethylsiloxane units and siloxane units represented by the following Structure (PSR):

$$—[Si(R_1)(R_2)—O]— \quad (PSR)$$

wherein $R_1$ and $R_2$ are independently alkyl, aryl, and alkenyl groups as long as at least one is an alkenyl group, (b) a silane crosslinking agent having SiH groups, (c) a platinum catalyst, and (d) optionally a stabilizer, or adhesion promoter, or both.

For the component a) noted above, the alkyl groups for $R_1$ and $R_2$ can be the same or different and can be substituted or unsubstituted and have from 1 to 50 carbon atoms. Similarly, the alkenyl groups can be the same or different and can also be substituted or unsubstituted and have 2 to 50 carbon atoms. The aryl groups can be the same or different and can be substituted or unsubstituted and have 6, 10, or 14 carbon atoms in the carbocyclic ring.

It may be useful for at least 50% of the $R_1$ and $R_2$ groups to be methyl groups to promote ink repellency. The resulting polysiloxane material having the units defined by Structure (PSR) may have a molecular weight of from about 5,000 to about 5,000,000 or typically from about 50,000 to about 2,500,000. The amount of polysiloxane material in Composition I is generally at least 60% and up to 99%, and typically from about 70% to about 99%, based on total solid weight.

Representative examples of polysiloxane materials having an SiH group [component (b)] in the molecular chain or at a terminal thereof are illustrated by the following Structures (PSR-I), (PSR-II), (PSR-III), (PSR-V), and (PSR-V) that are not to be interpreted as the only possible structures of polysiloxane materials:

(PSR-I)

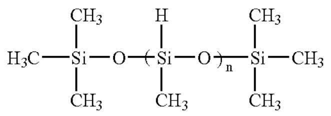

-continued (PSR-II)

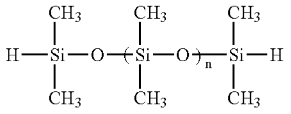

(PSR-III)

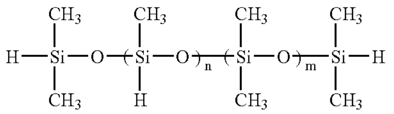

(PSR-IV)

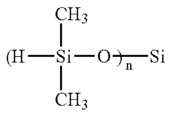

(PSR-V)

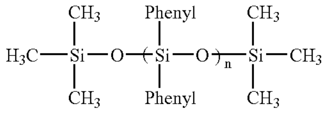

wherein "n" in each Structure is an integer greater than 1, and "m" is an integer greater than 0.

The amount of SiH groups in the SiH group-containing polysiloxane material is at least 2 in number and usually more than 3 in number. The amount of the polysiloxane material in Composition I is generally at least 0.1% and up to 20%, and typically from about 1% to about 15%, based on total solids. The quantity ratio of polysiloxane material to polydimethylsiloxane can be generally in the range of from about 1.5 to about 30 and typically from about 10 to 20.

Catalysts that are useful as component (c) in Composition I are platinum compounds that include but are not limited to platinum, platinum chloride, chloroplatinic acid, olefin coordinated platinum, alcohol modified complex of platinum, and a methylvinyl polysiloxane complex of platinum. The catalyst may be present in the curable Composition I in an amount generally of from about 0.01% to about 20% or typically from about 0.1% to 10%, based on the total composition solids (or dry silicone rubber layer). The amount of platinum in the cured layer is generally from about 10 to about 1000 ppm and typically from about 100 to about 500 ppm.

Optional stabilizers that can be present in Composition I as component (d) include but are not limited to, nitrogen-containing compounds, phosphorus-containing compounds, and unsaturated alcohols such as acetylene-containing alcohols. Such compounds can be present in an amount of from about 0.01% to about 10%, and typically from about 0.1% to about 5%, based on total solids in Composition I.

Optional adhesion promoters for Composition I include hydroxy-containing organopolysiloxanes or hydrolyzable functional group-containing silane or siloxanes. Composition may also include a filler such as silica or a silane coupling agent, a titanate-based coupling agent, or an aluminum-based coupling agent. Useful silane coupling agents include but are not limited to, alkoxysilanes, acetoxysilanes, ketoximinesilanes, and vinyl-containing coupling agents.

Composition II:

(a) a polydimethylsiloxane having SiOH, $SiOR_3$, or $SiOCOR_4$ terminal groups, or any combination thereof, wherein $R_3$ and $R_4$ are independently substituted or unsubstituted alkyl, aryl, or alkenyl groups, (b) a siloxane crosslinking agent having at least two of any of the SiOH, $SiOR_3$, or $SiOCOR_4$ groups, wherein $R_3$ and $R_4$ are as defined above, and (c) optionally a catalyst, adhesion promoter, or both.

Component (a) of Composition II can be a hydroxy-containing polydimethylsiloxane that is represented by the Structure (PSR) as defined above but in addition, the compounds have SiOH, $SiOR_3$, or $SiOCOR_4$ groups positioned at molecular terminals wherein $R_3$ and $R_4$ are the same or different and can be substituted or unsubstituted alkyl groups and have from 1 to 50 carbon atoms, the same or different substituted or unsubstituted alkenyl groups that can also be substituted or unsubstituted and have 2 to 50 carbon atoms, or the same or different substituted or unsubstituted aryl groups having 6, 10, or 14 carbon atoms in the carbocyclic rings.

The resulting polydimethylsiloxane with the noted terminal groups may have a molecular weight of from about 10,000 to about 600,000 or typically from about 30,000 to about 200,000. The amount of polysiloxane material in Composition II is generally at least 60% and up to 99%, and typically from about 70% to about 99%, based on total solid weight.

Siloxane crosslinking agents useful in Composition II include but are not limited to, acetoxysilanes, alkoxysilanes, ketoximinesilanes, allyloxysilanes and others known in the art that can be represented by the following Structure (SILANE):

$$(R_6)_{4-p}SiX_p \qquad \text{(SILANE)}$$

wherein p is an integer of 2 to 4 (typically 3 or 4), and $R_6$ represents a substituted or unsubstituted alkyl group having 1 to 50 carbon atoms, a substituted or unsubstituted alkenyl group having 2 to 50 carbon atoms, a substituted or unsubstituted aryl group having 6, 10, or 14 carbon atoms in the aromatic ring, or a group formed by combining two or more of the alkyl, alkenyl, and aryl groups. X represents a functional group selected from halogen atoms, alkoxy groups, acyloxy groups, ketoximine groups, aminoxy groups, amido groups, and alkenyloxy groups.

Examples of siloxane crosslinking agents [component (b) of Composition II] include but are not limited to, methyltriacetoxysilane, ethyltriacetoxysilane, vinyltriacetoxysilane, methyltrimethoxysilane, methyltriethoxysilane, ethyltrimethoxysilane, ethyltriethoxysilane, tetraethoxysilane, tetrapropoxysilane, vinyl trimethoxysilane, vinyltriphenoxysilane, vinyltriethoxysilane, allyltriethoxysilane, vinyltriisopropoxysilane, vinyl trisisopropenoxysilane, vinyl methylbis(methylethylketoximine)silane, methyltri(methylethylketoximine)silane, vinyltri(methylethylketoximine)silane, tetra(methylethylketoximine)silane, diisopropenoxydimethylsilane, triisopropenoxymethylsilane, and triallyloxysilane. The acetoxysilanes and ketoximinesilanes are particularly useful.

The amount of siloxane crosslinking agents present in Composition II is generally at least 1.5% and up to 20%, and typically from about 3% to about 10%, based on total composition solids. The ratio of siloxane crosslinking agent to the polydimethylsiloxane in Composition II is such that the molar ratio of functional groups "X" of the crosslinking agent to the hydroxy groups in the polydimethylsiloxane is generally from about 1.5 to about 10.0.

Optional catalysts for component (c) of Composition II include but are not limited to, acids such as organic carboxylic acids including acetic acid, propionic acid, and maleic acid, toluenesulfonic acid, boric acid, and others readily apparent to one skilled in the art, alkalis such as potassium hydroxide, sodium hydroxide, and lithium hydroxide, amines, metal alkoxides such as titanium tetrapropoxide and titanium tetrabutoxide, metal diketenates such as iron acetylacetonate and titaniumacetylacetonatedipropoxide, and organic acid salts of metals such as acid salts of tin, lead, zinc, iron, cobalt, calcium, and manganese. Specific useful catalysts are dibutyltin diacetate, dibutyltin dioctate, dibutyltin dilaurate, zinc octylate, and iron octylate. The catalysts may be present in Composition II in an amount of from about 0.01% to about 20% and typically from about 0.1% to about 10%, based on total solids.

Adhesion promoters that may be present in Composition II include but are not limited to, those described above for Composition I in similar amounts. In addition, fillers such silicas may be present in Composition II.

The crosslinked silicone rubber layer has a dry thickness of from about 0.5 to about 3.5 μm that generally corresponds to a dry coverage of from about 0.5 to about 5 g/$m^2$ and typically from about 1 to about 4 g/$m^2$ to provide desired ink repellency, scratch resistance, and printing durability.

Preparation of Imageable Elements

The imageable element can be prepared by sequentially applying a non-silicone, non-crosslinked layer formulation over the surface of the substrate (and any optional primer layers), and then applying a silicone rubber composition over the non-silicone layer.

For example, the non-silicone, non-crosslinked layer can be applied by dispersing or dissolving the desired ingredients in a suitable coating solvent or mixture thereof. The resulting formulation is applied to the substrate using suitable equipment and procedures, such as spin coating, knife coating, gravure coating, die coating, slot coating, bar coating, wire rod coating, roller coating, or extrusion hopper coating. The formulation can also be applied by spraying onto a suitable substrate (such as an on-press printing cylinder).

The selection of solvents used to coat the non-silicone layer depends upon the nature of the first polymeric binder(s), other polymeric materials, and other components in the formulations. Generally, the non-silicone non-crosslinked layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

Alternatively, the non-silicone, non-crosslinked layer may be applied by extrusion coating methods from melt mixtures of the layer composition. Typically, such melt mixtures contain no volatile organic solvents.

Intermediate drying steps may be used between applications of the various layer formulations to remove solvent(s) before coating other layer formulations. Drying steps may also help in preventing the mixing of the various layers.

The crosslinked silicone rubber layer Composition I or II can be applied over the non-silicone, non-crosslinked layer in any suitable fashion (for example, lamination) and heat-treated at 50 to 200° C. for up to 4 minutes to effect curing or crosslinking.

A protective layer may be disposed on the crosslinked silicone rubber layer. Such protective layers can be polyester, polypropylene, polyvinyl alcohol, ethylene-vinyl acetate copolymer saponified, or polyvinylidene chloride films. The protective layer or film can be formed or laminated to the silicone rubber layer using known procedures. The layer can be from about 10 to about 100 μm in dry thickness. The protective layer is generally peeled off or otherwise removed before or after imaging and before development and printing.

Imaging and Development

The imageable elements can have any useful form including, but not limited to, printing plate precursors, printing cylinders, printing sleeves (solid or hollow cores) and printing tapes (including flexible printing webs). For example, the imageable members can be printing plate precursors useful for providing lithographic printing plates.

Printing plate precursors can be of any size or shape (for example, square or rectangular) having the requisite non-silicone, non-crosslinked layer and crosslinked silicone rubber layer disposed on a suitable substrate. Printing cylinders and sleeves are known as rotary printing members having a substrate and the requisite layer in cylindrical form. Hollow or solid metal cores can be used as substrates for printing sleeves.

During use, the imageable elements are exposed to a suitable source of infrared radiation at a wavelength of from about 700 to about 1500 nm and typically from about 700 to about 1200 nm. The lasers used to expose the imageable elements are usually diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 1120 nm.

The imaging apparatus can function solely as a platesetter or it can be incorporated directly into a lithographic printing press. In the latter case, printing may commence immediately after imaging with an infrared laser and removing the crosslinked silicone rubber layer in the infrared laser imaged regions, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Kodak® Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI and QMDI presses (available from Heidelberg, Dayton, Ohio).

Imaging sensitivities may be in the range of from about 75 to about 300 mJ/$cm^2$, and typically from about 110 to about 170 mJ/$cm^2$.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with water or a suitable aqueous solution (described below) removes predominantly only the crosslinked silicone rubber layer and an upper portion of the non-silicone, non-crosslinked layer in the exposed regions. The exposed (or imaged) regions are ink-accepting while the non-exposed (or non-imaged) regions of the crosslinked silicone rubber layer are ink-repelling. Development can be carried out in one or two steps using the same or different aqueous solutions, and either step can be accompanied by use of mechanical removal means as described below.

In a practicing the present invention, imaging is carried out with infrared radiation that is followed by development for example, with water or an aqueous solution consisting essentially of a surfactant (or having less than 8 weight % organic solvents), and optionally mechanical removal means, to remove imaged regions. Imaging promotes deformation in the upper portion of the non-silicone, non-crosslinked layer that can be removed along with the overlying crosslinked silicone rubber layer. The residue of the non-silicone, non-crosslinked layer in the imaged regions is left on the printing plate and accepts ink during printing while the non-imaged regions of the crosslinked silicone rubber layer repels ink. While the substrate does not need to be treated to accept or repel ink, it can be treated in a suitable manner (described above) to promote adhesion to the residue of the non-silicone, non-crosslinked layer that remains after imaging and development.

In still another embodiment, imaging is carried out with infrared radiation and the imaged regions of the crosslinked silicone rubber layer and the upper portion of the non-silicone, non-crosslinked layer are removed by a mechanical removal means such as brushes, with or without vacuum. No developing solutions are used, and as in the embodiment noted above, the residue of the non-silicone, non-crosslinked layer remains to accept ink during printing.

Mechanical means for removing imaged materials during development include various wiping means (such as a rag, sponge, or cloth) or soft brushes.

If aqueous solutions consisting essentially of one or more surfactants are used for development, they generally have a pH greater than 6 and up to about 12. The surfactants can be anionic and include those with carboxylic acid, sulfonic acid, or phosphonic acid groups (or salts thereof). Anionic surfactants having sulfonic acid (or salts thereof) groups are particularly useful. For example, anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphate alkylester, salts of alkylsulfuric esters, sulfuric esters of polyoxyethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary or "first" anionic surfactant. Such surfactants can be obtained from various suppliers as described in McCutcheon's Emulsifiers & Detergents, 2007 Edition.

Particular examples of such surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate.

The one or more anionic surfactants are generally present in an amount of at least 0.1 weight %, and typically from about 0.1 to about 10 weight %, or from about 1 to about 10 weight % (based on the weight of the solution).

The aqueous solutions may also include nonionic surfactants as described in [0029] or hydrophilic polymers described in [0024] of EP 1,751,625 (noted above), incorporated herein by reference. Particularly useful nonionic surfactants include Mazolt® PG031-K (a triglycerol monooleate, Tween® 80 (a sorbitan derivative), Pluronic® L62LF (a block copolymer of propylene oxide and ethylene oxide), and Zonyl® FSN (a fluorocarbon). These nonionic surfactants can be present in an amount of up to 10 weight %, but at usually less than 2 weight %.

Other optional components of an aqueous solution used for development include wetting agents (such as a glycol), a metal chelating agents, antiseptic agents, anti-foaming agents, and viscosity increasing agents as noted above. The amounts of such components are known in the art. Metal ion chelating agents are particularly useful, including but not limited to, polyaminopolycarboxylic acids, aminopolycarboxylic acids, or salts thereof, [such as salts of ethylenediaminetetraacetic acid (EDTA, sodium salt)], organic phosphonic acids and salts thereof, and phosphonoalkanetricarboxylic acids and salts thereof. Organic amines may also be useful.

Generally, the developing solution is applied to the imaged element by rubbing, spraying, jetting, dipping, coating, or wiping it with the aqueous solution or a roller, impregnated pad, or applicator containing the aqueous solution. For example, the imaged element can be brushed with water or the aqueous solution, or the aqueous solution may be poured on or applied by spraying the exposed regions with sufficient force to remove them using a spray nozzle system as described for example in [0124] of EP 1,788,431A2 (noted above). Still again, the imaged element can be immersed in water or an aqueous solution and rubbed by hand or with a mechanical removal means.

Water or an aqueous solution can also be applied in a unit or station that has at least one roller for rubbing or brushing the imaged element while water or the aqueous solution is applied during development. The developing solution can be collected in a tank and used several times, and replenished if necessary from a reservoir of aqueous solution. A replenisher can be of the same concentration as the solution used in development, or be provided in concentrated form and diluted with water at an appropriate time.

Following development, the imaged element can be dried in a suitable fashion.

Imaging and development can be carried out on-press, and the imaged and developed element can be used for printing by contacting it on-press with only a lithographic printing ink (absent a fountain solution).

Special lithographic ink designed for waterless printing (without fountain solution) can be applied to the printing surface of the imaged element for printing. The non-exposed regions of the crosslinked silicone rubber layer repel ink and the exposed regions of the non-silicone, non-crosslinked layer residue revealed by the imaging and development process accepts the ink. The ink is then transferred to a suitable receiving material (such as cloth, paper, metal, glass, or plastic) to provide a desired impression of the image thereon. If required, an intermediate "blanket" roller can be used to transfer the ink from the imaged member to the receiving material. During long print runs, the imaged members can be cleaned using conventional cleaning means and chemicals.

The following examples are presented to illustrate the practice of this invention but are not intended to be limiting in any manner.

EXAMPLES

Materials and Methods

Byk® 307 is a polyethoxylated dimethylpolysiloxane copolymer that is available from Byk Chemie (Wallingford, Conn.) in a 20 wt. % solution of methoxypropan-2-ol (available as Dowanol® PM).

BLO represents γ-butyrolactone.

Copolymer A represents a copolymer having recurring units derived from N-phenylmaleimide, methacrylamide, and methacrylic acid (41.5:37.5:21 mol %) using conventional conditions and procedures and had an acid number of 96.5.

Copolymer B represents a copolymer having recurring units derived from N-phenylmaleimide, methacrylamide, and acrylonitrile, and the following recurring unit at a weight ratio of 5:10:45:40:

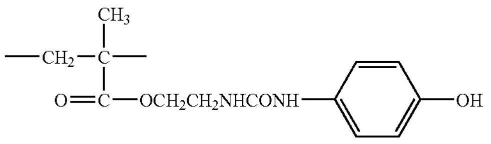

D11 dye is ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1) as supplied by PCAS (Longjumeau, France), having the following structure:

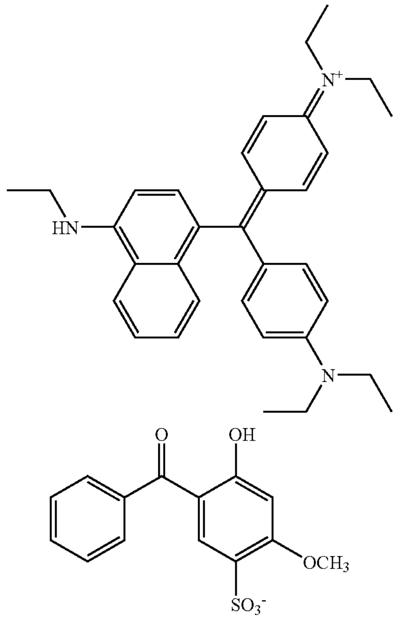

Evonic Dynasylan 1204 is an aminofunctional silane composition that acts as an adhesion promoter between inorganic materials (for example a metal) and organic polymers, which was obtained from Degussa (Germany).

IR Dye A (Trump dye) is an infrared absorbing dye supplied by Eastman Kodak of Rochester, N.Y. and has the following structure:

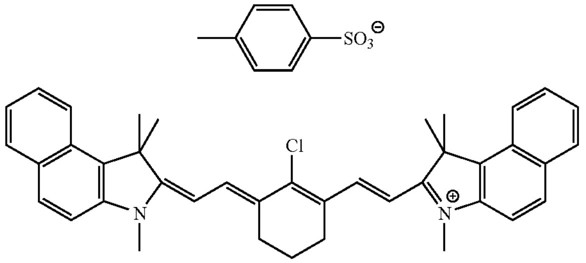

IR Dye A

MEK represents methyl ethyl ketone.

PGME represents 1-methoxypropan-2-ol (available as Dowanol® PM).

Resole BPA-1100 (formerly GP 649D99) is a solution of Bis-phenol A resole in PGME at 24% solids that was obtained from Georgia Pacific (Atlanta, Ga.).

Substrate A is a 0.3 mm gauge aluminum sheet that had been electrograined, anodized, and treated with poly(vinyl phosphonic acid).

Wacker Dehesive® 944 silicone, Wacker V24 crosslinking agent, and Wacker Catalyst OL catalyst were all obtained from Wacker Chemie Ag (Germany).

Non-Silicone, Non-Crosslinked Layer Formulation Y:

| | |
|---|---|
| MEK | 42.24 parts |
| PGME | 30.88 parts |
| BLO | 9.387 parts |

-continued

| | |
|---|---|
| Water | 9.387 parts |
| Copolymer A | 3.556 parts |
| Copolymer B | 0.917 parts |
| Resole BPA-1100 | 2.446 parts |
| IR Dye A | 0.917 parts |
| D11 dye | 0.092 parts |
| Byk ® 307 | 0.177 parts |

Silicone Rubber Layer Formulation Z:

| | |
|---|---|
| Wacker Dehesive ® 944 silicone | 90.48 parts |
| Wacker V24 crosslinking agent | 3.006 parts |
| Wacker Catalyst OL catalyst | 5.013 parts |
| Evonic Dynasylan 1204 | 1.503 parts |

Invention Example 1

A two-layer lithographic printing plate precursor was prepared by applying the non-silicone non-crosslinked layer formulation Y to Substrate A and dried for 45 seconds at 135° C. to provide a dry coating weight of approximately 1.40 g/m$^2$.

The silicone rubber layer formulation Z was then applied to this dried layer to provide a dry silicone rubber thickness of about 1.9 μm after curing at 140° C. for about 4 minutes.

Samples of the resulting non-ablative imageable element were imaged using a Kodak® Trendsetter SPECTRUM 800 at various imaging energies from 110 mJ/cm$^2$ to 250 mJ/cm$^2$ at 20 mJ/cm$^2$ increments. The imaging file included 0-100% tints and 1 to 4 pixels wide lines. The imaged elements were then developed by wiping them with water to remove the silicone rubber layer and the upper portion of the non-silicone layer in the non-exposed regions, and the resulting printing plates were then inked and used for printing. From the printed impressions, it was apparent that 110 mJ/cm$^2$ was not sufficient energy for imaging the elements but 130 mJ/cm$^2$ was. All tints were printed at that energy (2-100% 200 lpi). The print run was stopped after 70,000 impressions.

In order to demonstrate the robustness of the invention imageable element, an imaged and developed printing plate of this invention was mounted on a printing press and a few copies were printed. The printing plate was then washed with a Butyl Cellusolve (BC)/water (20:80 by weight) on the printing press and a few more copies were printed. The printing plate was then rewashed but with a solution of BC/water (40:60 weight %) and more copies were printed. This last step was repeated three times, each time with a higher concentration of BC in water, with the final rinse being 100% BC. Each time a few copies were printed. At all stages, the solvent did not adversely affect the printed copies. This demonstrates the chemical resistance property of the printing plates of this invention.

Invention Examples 2 and 3

The imageable element described in Invention Example 1 was imaged as described therein at 130 mJ/cm$^2$ but processed using either an aqueous solution of Tween® 80 nonionic surfactant (1 weight %) for Example 2, or an aqueous solution of Zonyl® FTS nonionic surfactant (1 weight %) for Example 3. In both instances, a suitable image was obtained that was then used for acceptable waterless printing (1-100% tints 200 lpi). The print run was stopped after 70,000 impressions.

Invention Example 4

An imageable element like that described in Invention Example 1, but without the crosslinked silicone rubber layer, was cut into 5 pieces (each 10×10 cm) and weighed. The non-silicone, non-crosslinked layer was then removed from each by immersing and rubbing them with Developer 956 (Eastman Kodak Company). Then, the remaining aluminum substrate from each piece was weighed to calculate the amount of non-silicone, non-crosslinked layer that had been removed in the developer.

The same process was carried out on two sets of five samples of the same element that had been imaged and processed according to the present invention. Element A and Element B in the following Table represent the two sets. The non-silicone, non-crosslinked layer was removed in the developer and the remaining aluminum substrate was weighed. We then compared of the removed non-silicone, non-crosslinked layer from the non-imaged element to that removed from the imaged element. We found that the difference in removed layer compositions varied from 0 to 3.6% as shown in the following Table of data:

| | Average Element Weight Before Removal of Imaging Layer | Average Element Weight After Removal of Non-Crosslinked Layer | Imaging Layer Weight | % Difference |
|---|---|---|---|---|
| Layer weight | 7.3811 | 7.3692 | 0.0119 | |
| Element A | 7.3781 | 7.3666 | 0.0114 | 3.6% |
| Element B | 7.3741 | 7.3622 | 0.0119 | 0% |

This indicates that imaging according to the present invention does not ablate the non-silicone, non-crosslinked layer because the developer removed about the same amount of the layer composition from both imaged and non-imaged element.

Invention Example 5 and Comparative Example 1

Two imageable elements were formed:

For Invention Example 5, the top crosslinked silicone rubber layer was disposed over the non-crosslinked polymer layer according to this invention. Comparative Example 1 comprised the same crosslinked silicone rubber layer disposed over an ablative crosslinked nitrocellulose carbon black layer. Both elements were evaluated after a 100% solids image was formed.

Lower Layers (IR-Sensitive Layer):

Ablative Crosslinked Layer (Comparison):

Nitrocellulose (2.64 g, 70% in isopropanol) and Cymel 1170 (1.2 g, Cytec) were dissolved in butyl acetate (44.17 g) and n-butanol (6.06 g). Cabot Carbon Black mogul L (3.39 g) was added to this mixture that was milled for 24 hours. Then Cycat 600 (0.212 g, Cytec), diallyl phthalate (0.134 g), butyl acetate (9.3 g), cyclohexanone (2.8 g), isopropanol (2.8 g), and t-butyl acetate (31.6 g) were added. The formulation was then coated onto sample of a substrate of poly(ethylene terephthalate) that was laminated onto aluminum and cured at 140° C. for 4 minutes in an oven. The coating dry coverage was 0.5 g/m$^2$.

Non-Crosslinked Polymer Layer (Invention Layer):

Copolymer A (2.06 g), IR Dye A (0.38 g), Dye D11 (0.038 g), and Byk® 307 (0.028 g) were mixed in 37.5 g of a solvent mixture comprising MEK:PM:BLO:water (35/45/10/10 weight ratio). The formulation was then coated onto a sample of Substrate A and dried for 45 seconds at 135° C. to provide a dry coating weight of about 1.4 g/m$^2$.

Crosslinked Silicone Rubber Layer Formulation (used in both Invention Example 5 and Comparative Element 1)

Wacker Dehesive® 944 (17.62 g) was dissolved in a mixture of toluene (33.38 g) and heptane (48.23 g). Crosslinker V24 (0.176 g), Catalyst OL (0.293 g), and Dynasylan 1204 (0.293 g) were added to the mixture. This formulation was then coated onto the dried bottom layers described above and cured at 140° C. for 4 minutes to provide a dry coating coverage of 1.9 g/m$^2$.

Both of the resulting imageable elements were exposed with a 100% image using a Kodak® Trendsetter SPECTRUM 800 CTP platesetter.

Samples of Invention Example 5 were separately exposed at energies of 150, 200, and 250 mJ/cm$^2$. Samples of Comparative Example 1 were similarly exposed but only at 200 and 250 mJ/cm$^2$ because 150 mJ/cm$^2$ was insufficient energy to produce an image. All exposed elements were then rubbed with a brush to determine the nature of the debris that was formed during imaging.

A distinct difference was observed between the debris from the samples of Invention Example 5 and the debris from the samples of Comparative Example 5 at both higher exposure energies. For Invention Example 5, having the non-crosslinked polymer layer, the imaged silicone debris was crumbly and the removed debris did not stick together. For Comparative Example 1, the imaged regions appeared to be ablated and the silicone debris was rubbery to such an extent that large rubbery pieces remained intact.

Thus, it is apparent that the crosslinked silicone rubber layer behaved differently depending upon which bottom layer was used.

This comparison of the two imageable elements indicates that the particular bottom layer (non-crosslinked polymer layer) is important for high imaging speed and wide exposure range where the removed silicone rubber debris does not stick together.

The invention has been described in detail with particular reference to certain preferred embodiments thereof, but it will be understood that variations and modifications can be effected within the spirit and scope of the invention.

The invention claimed is:

1. An imageable element imageable by non-ablative process useful for waterless printing, said element comprising a substrate having thereon, in order, the following contiguous essential layers:

an ink-accepting non-silicone, non-crosslinked layer comprising a first polymeric binder and an infrared radiation absorbing compound, wherein said first polymeric binder comprises recurring units that have been derived from a (meth)acrylonitrile and an N-substituted cyclic imide, and optionally recurring units that have been derived from a (meth)acrylamide, and an ink-repelling crosslinked silicone rubber layer disposed directly on said non-silicone, non-crosslinked layer, wherein said first polymeric binder is present in an amount of at least 60 weight % and said ink-receptive non-silicone, non-crosslinked layer has a dry coverage of from about 0.7 to about 3 g/m$^2$ and, wherein said ink-accepting non-silicone, non-crosslinked layer has chemical resistance such that the loss in dry coating weight is less than 35% as demonstrated by soaking said dried ink-accepting non-silicone, non-crosslinked layer alone on a substrate for five minutes in a 2-butoxyethanol:water 80:20 weight solution at room temperature.

2. The element of claim 1 wherein said ink-repelling crosslinked silicone rubber layer is derived from either Composition I or Composition II defined as follows:

Composition I that comprises:

(a) a polysiloxane material having predominantly dimethylsiloxane units and siloxane units represented by the following Structure (PSR):

$$[Si(R_1)(R_2)—O]— \quad (PSR)$$

wherein $R_1$ and $R_2$ are independently alkyl, aryl, and alkenyl groups as long as at least one is an alkenyl group, (b) a silane crosslinking agent having SiH groups, (c) a platinum catalyst, and (d) optionally a stabilizer, or adhesion promoter, or both, Composition II that comprises:

(a) a polydimethylsiloxane having SiOH, $SiOR_3$, or $SiOCOR_4$ terminal groups, or any combination thereof, wherein $R_3$ and $R_4$ are independently substituted or unsubstituted alkyl, aryl, or alkenyl groups, (b) a siloxane crosslinking agent having at least two of any of the SiOH, $SiOR_3$, or $SiOCOR_4$ groups, wherein $R_3$ and $R_4$ are as defined above, and (c) optionally a catalyst, adhesion promoter, or both.

3. The element of claim 1 wherein said ink-repelling crosslinked silicone rubber layer has a thickness of from about 0.5 to about 3.5 μm.

4. The element of claim 1 wherein said infrared radiation absorbing compound is an IR absorbing dye that is present only in said ink-accepting non-silicone, non-crosslinked layer in an amount of at least 8 weight %.

5. The element of claim 1 that is a lithographic printing plate precursor having an aluminum-containing substrate.

6. The element of claim 1 wherein said ink-accepting non-silicone, non-crosslinked layer comprises an adhesion promoting compound that promotes adhesion between said ink-accepting non-silicone, non-crosslinked layer and said ink-repelling crosslinked silicone rubber layer, and said adhesion promoting compound comprises one or more vinyl, SiH, SiOH, $SiOR_3$, $SiOCOR_4$, or epoxy groups wherein $R_3$ and $R_4$ are independently substituted or unsubstituted alkyl or aryl groups.

7. A method of making an imaged element suitable for waterless printing, said method comprising, without ablation:

A) imagewise exposing an imageable element that is imageable using a non-ablative process and useful for waterless printing using infrared radiation to provide both exposed and non-exposed regions in said imageable element, said non-ablative imageable element comprising a substrate having thereon, in order, the following contiguous essential layers:

an ink-accepting non-silicone, non-crosslinked layer comprising a first polymeric binder and an infrared radiation absorbing compound, wherein said first polymeric binder comprises recurring units that have been derived from a (meth)acrylonitrile and an N-substituted cyclic imide, and optionally recurring units that have been derived from a (meth)acrylamide, and an ink-repelling crosslinked silicone rubber layer disposed directly on said non-silicone, non-crosslinked layer, and wherein said first polymeric binder is present in an amount of at least 60 weight % and said ink-receptive non-silicone, non-crosslinked layer has a dry coverage of from about 0.7 to about 3 $g/m^2$ and, B) removing the ink-repelling crosslinked silicone rubber layer and an upper portion of less than 10% of said ink-accepting non-silicone, non-crosslinked layer in predominantly only in said exposed regions to provide an imaged element, solely by:

a) contacting said imagewise exposed imageable element with water or an aqueous solution comprising less than 8 weight % organic solvents, b) by applying mechanical removal means to said imagewise exposed imageable element, or c) by a combination of contacting said imagewise exposed imageable element with water or an aqueous solution comprising less than 8 weight % organic solvents and applying mechanical removal means.

8. The method of claim 7 wherein said imagewise exposing is carried out at from about 70 to about 300 $mJ/cm^2$.

9. The method of claim 8 wherein said ink-repelling crosslinked silicone rubber layer has a thickness of from about 0.5 to about 3.5 μm and is derived from either Composition I or Composition II defined as follows:

Composition I that comprises:

(a) a polysiloxane material having predominantly dimethylsiloxane units and siloxane units represented by the following Structure (PSR):

$$[Si(R_1)(R_2)—O]— \quad (PSR)$$

wherein $R_1$ and $R_2$ are independently alkyl, aryl, and alkenyl groups as long as at least one is an alkenyl group, (b) a silane crosslinking agent having SiH groups, (c) a platinum catalyst, and (d) optionally a stabilizer, or adhesion promoter, or both, Composition II that comprises:

(a) a polydimethylsiloxane having SiOH, $SiOR_3$, or $SiOCOR_4$ terminal groups, or any combination thereof, wherein $R_3$ and $R_4$ are independently substituted or unsubstituted alkyl, alkenyl, or aryl groups, (b) a siloxane crosslinking agent having at least two of any of the SiOH, $SiOR_3$, or $SiOCOR_4$ groups, wherein $R_3$ and $R_4$ are as defined above, and (c) optionally a catalyst, adhesion promoter, or both, and said infrared radiation absorbing compound is an IR absorbing dye that is present only in said ink-accepting non-silicone, non-crosslinked layer in an amount of at least 8 weight %.

10. The method of claim 7 wherein said ink-accepting non-silicone, non-crosslinked layer has chemical resistance such that the loss in dry coating weight is less than 35% as demonstrated by soaking said dried ink-accepting non-silicone, non-crosslinked layer alone on a substrate for five minutes in a 2-butoxyethanol:water 80:20 weight solution at room temperature.

11. The method of claim 7 wherein step B is carried out using a combination of water or said aqueous solution consisting essentially of a surfactant and a removal means.

12. A method of making printed images by waterless printing, said method comprising, without ablation:

A) imagewise exposing an imageable element that is imageable using a non-ablative process and useful for waterless printing using infrared radiation to provide both exposed and non-exposed regions in said imageable element, said imageable element comprising a substrate having thereon, in order, the following contiguous essential layers:

an ink-accepting non-silicone, non-crosslinked layer comprising a first polymeric binder and an infrared radiation absorbing compound, wherein said first polymeric binder comprises recurring units that have been derived from a (meth)acrylonitrile and an N-substituted cyclic imide, and optionally recurring units that have been derived from a (meth)acrylamide, and an ink-repelling crosslinked silicone rubber layer disposed directly on said non-silicone, non-crosslinked layer, wherein said first polymeric binder is present in an amount of at least 60 weight % and said ink-receptive non-silicone, non-crosslinked layer has a dry coverage of from about 0.7 to about 3 $g/m^2$ and, B) removing the ink-repelling crosslinked silicone rubber layer and an upper portion of less than 10% of said ink-accepting non-silicone, non-crosslinked layer in predominantly only said exposed regions to provide an imaged element, and C) contacting said imaged element on-press with only a lithographic printing ink.

13. The method of claim 12 wherein said ink-repelling crosslinked silicone rubber layer has a thickness of from about 0.5 to about 3.5 μm and is derived from either Composition I or Composition II defined as follows:

Composition I that comprises:

(a) a polysiloxane material having predominantly dimethylsiloxane units and siloxane units represented by the following Structure (PSR):

$$[Si(R_1)(R_2)—O]— \quad (PSR)$$

wherein $R_1$ and $R_2$ are independently alkyl, aryl, and alkenyl groups as long as at least one is an alkenyl group, (b) a silane crosslinking agent having SiH groups, (c) a platinum catalyst, and (d) optionally a stabilizer, or adhesion promoter, or both, Composition II that comprises:

(a) a polydimethylsiloxane having SiOH, $SiOR_3$, or $SiOCOR_4$ terminal groups, or any combination thereof, wherein $R_3$ and $R_4$ are independently substituted or unsubstituted alkyl, alkenyl, or aryl groups, (b) a siloxane crosslinking agent having at least two of any of the SiOH, $SiOR_3$, or $SiOCOR_4$ groups, wherein $R_3$ and $R_4$ are as defined above, and said ink-accepting non-silicone, non-crosslinked layer has chemical resistance such that the loss in dry coating weight is less than 35% as demonstrated by soaking said dried ink-accepting non-silicone, non-crosslinked layer alone on an aluminum substrate for five minutes in a 2-butoxyethanol:water 80:20 weight solution at room temperature.

14. The method of claim 12 wherein step B is carried out by:

a) contacting said imagewise exposed imageable element with water or an aqueous solution comprising less than 8 weight % organic solvents, b) by applying a removal means to said imagewise exposed imageable element, or c) by a combination of contacting said imagewise exposed imageable element with water or an aqueous solution comprising less than 8 weight % organic solvents and applying a removal means.

15. The method of claim 12 wherein said ink-accepting non-silicone, non-crosslinked layer has chemical resistance such that the loss in dry coating weight is less than 35% as demonstrated by soaking said dried ink-accepting non-silicone, non-crosslinked layer alone on a substrate for five minutes in a 2-butoxyethanol:water 80:20 weight solution at room temperature.

16. The method of claim 12 wherein said ink-repelling crosslinked silicone rubber layer is delaminated from said non-silicone, non-crosslinked in predominantly only said exposed regions during imagewise exposing step A.

* * * * *